(12) United States Patent
Bhushan et al.

(10) Patent No.: US 7,265,639 B2
(45) Date of Patent: Sep. 4, 2007

(54) METHODS AND APPARATUS FOR RING OSCILLATOR BASED MOSFET GATE CAPACITANCE MEASUREMENTS

(75) Inventors: Manjul Bhushan, Hopewell Junction, NY (US); Mark B. Ketchen, Hadley, MA (US)

(73) Assignee: International Business Machines Corporation, Armonk, NY (US)

(*) Notice: Subject to any disclaimer, the term of this patent is extended or adjusted under 35 U.S.C. 154(b) by 119 days.

(21) Appl. No.: 11/197,918

(22) Filed: Aug. 5, 2005

(65) Prior Publication Data
US 2007/0046383 A1  Mar. 1, 2007

(51) Int. Cl.
*H03K 3/03* (2006.01)
*H03B 5/12* (2006.01)
*G01R 31/26* (2006.01)
*G01R 27/26* (2006.01)

(52) U.S. Cl. .......................... 331/57; 331/49; 324/769; 324/658

(58) Field of Classification Search .................. 331/57, 331/176, 66, 46, 49, 55, 56, 185, 186, 45; 327/272, 278, 264, 281, 254; 712/117, 118, 712/124, 125, 57, 700; 324/769, 176, 166, 324/71.5, 71.6, 652, 658, 765
See application file for complete search history.

(56) References Cited

U.S. PATENT DOCUMENTS 6,166,607 A * 12/2000 Schoellkopf .................. 331/57
7,193,427 B2 * 3/2007 Persun et al. ................ 324/765
2003/0146771 A1 * 8/2003 Moore ......................... 324/765
2004/0100333 A1 * 5/2004 Mizuno et al. ................ 331/46
2004/0100336 A1 * 5/2004 Christensen et al. .......... 331/57
2005/0134394 A1 * 6/2005 Liu .............................. 331/57

OTHER PUBLICATIONS

Y. Taur et al., "Fundamentals of Modern VLSI Devices," Cambridge University Press, pp. 68-78, 1998.
N.H.E. Weste et al., "Principles of CMOS VLSI Design," A System Perspective, Second Edition, Chapter 4, Addison-Wesley Publishing Company, pp. 180-188, 1993.
R.J. Baker et al., "CMOS Circuit Design, Layout, and Simulation," IEEE Press Series on Microelectronic Systems, pp. 84-87, 1998.

* cited by examiner

*Primary Examiner*—Robert Pascal
*Assistant Examiner*—Ryan J Johnson
(74) *Attorney, Agent, or Firm*—Ryan, Mason & Lewis, LLP

(57) ABSTRACT

An integrated circuit device is provided having a reference ring oscillator circuit having a plurality of stages. Each stage has a logic gate and electrically connecting to a first independent voltage source. The integrated circuit device also has at least one additional ring oscillator circuit having a plurality of stages. Each stage has a logic gate substantially identical to the logic gates of the reference ring oscillator circuit and electrically connecting to a respective at least one second independent voltage source. Each stage also has a FET load driven by the logic gate and electrically connecting to a third independent voltage source. A measured difference in capacitance between the reference ring oscillator circuit per stage and the at least one additional ring oscillator circuit per stage comprises a gate capacitance of a FET load.

21 Claims, 4 Drawing Sheets

METHODS AND APPARATUS FOR RING OSCILLATOR BASED MOSFET GATE CAPACITANCE MEASUREMENTS

FIELD OF THE INVENTION

The present invention relates generally to integrated circuit devices and, more particularly, to inline techniques for measuring a gate capacitance of a field effect transistor.

BACKGROUND OF THE INVENTION

As scaling limits of complementary metal oxide semiconductor (CMOS) technology are extended beyond 90 nanometers (nm), accurate measurements of metal oxide semiconductor field effect transistor (MOSFET) gate capacitance in the manufacturing line has become less feasible. The measurement of gate capacitance is critical in silicon (Si) manufacturing as it is used to determine both the gate oxide thickness and the polysilicon line-width, Lp. In addition, the voltage dependence of the gate capacitance (C-V characteristic) is used in building the MOSFET device model for circuit simulation applications.

Currently, the gate capacitance may be measured by utilizing complex off-line bench tests. The gate capacitance may also be measured inline on a structure with a thicker gate-oxide (greater than 1.5 nm), assuming that the characteristics of the thin and thick oxide structures are identical in determining Lp. However, gate-oxide thicknesses that are less than 1.2 nm combined with a corresponding exponential increase in the gate-tunneling current with oxide-thickness causes the traditional methods of measuring small signal capacitance to fail because of the presence of a high parallel conductance.

Thus, it would be highly desirable to provide inline testable structures that have the ability to measure a gate capacitance when the gate-oxide thickness is less than 1.2 nm.

SUMMARY OF THE INVENTION

The present invention provides techniques for measuring gate capacitance of a field effect transistor (FET) load utilizing a configuration of ring oscillators for comparison purposes.

For example, in one aspect of the present invention, an integrated circuit device is provided having a reference ring oscillator circuit with a plurality of stages. Each stage has a logic gate electrically connecting to a first independent voltage source. The integrated circuit device also has at least one additional ring oscillator circuit with a plurality of stages. Each stage has a logic gate substantially identical to the logic gates of the reference ring oscillator circuit, and electrically connecting to a respective at least one second independent voltage source. Each stage also has a FET load driven by the logic gate and electrically connecting to a third independent voltage source. A measured difference in capacitance between the reference ring oscillator circuit per stage and the at least one additional ring oscillator circuit per stage comprises a gate capacitance of a FET load.

In additional embodiments of the present invention, the number of stages in the reference ring oscillator circuit is substantially equal to the number of stages in the at least one additional ring oscillator circuit. The gate capacitance of a FET load is a small signal gate capacitance of a FET load at the applied gate bias and the logic gate is an inverting logic gate. Peak-to-peak amplitude of a voltage swing for the gate capacitance measurement is substantially equal to a voltage of the second independent voltage source.

In accordance with another aspect of the invention, a method of measuring gate capacitance is provided. A capacitance of a reference ring oscillator circuit is measured. The reference ring oscillator circuit has a plurality of stages, each stage having a logic gate electrically connecting to a first independent voltage source. A capacitance of at least one additional ring oscillator circuit is measured. The at least one additional ring oscillator circuit has a plurality of stages, each stage having a logic gate substantially identical to the logic gates of the reference ring oscillator circuit and electrically connecting to a respective at least one second independent voltage source. Each stage also has a FET driven by the logic gate and electrically connecting to a third independent voltage source. The difference between the measured capacitance of the reference ring oscillator circuit per stage and the at least one additional ring oscillator circuit per stage is calculated to determine a gate capacitance of a FET load.

In additional illustrative embodiments, the step of measuring a capacitance of at least one additional ring oscillator circuit and calculating the difference between the measured capacitances is repeated for a number of different voltage values from the third independent voltage source in order to produce a small signal capacitance versus bias voltage characteristic of a FET load.

Additionally, the reference ring oscillator circuit is operated by a voltage from the first independent voltage source, while the at least one additional ring oscillator circuit is held at ground. A capacitance per stage of the reference ring oscillator circuit is determined from a frequency and active and standby currents of the reference ring oscillator circuit. The at least one additional ring oscillator circuit is operated by a voltage from the second independent voltage source, while the reference ring oscillator circuit is held at ground. The voltage of the second independent voltage source is substantially equal to the voltage of the first independent voltage source. A voltage from a third independent voltage source is applied to the FET, resulting in an oscillating voltage across a gate of the FET. A capacitance per stage of the at least one additional ring oscillator circuit is determined from a frequency and active and standby currents of the at least one additional ring oscillator circuit.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

As will be illustrated in detail below, the present invention introduces techniques for inline measurement of gate capacitance of a FET load using a configuration of ring oscillator circuits for comparison purposes.

Figure 1:
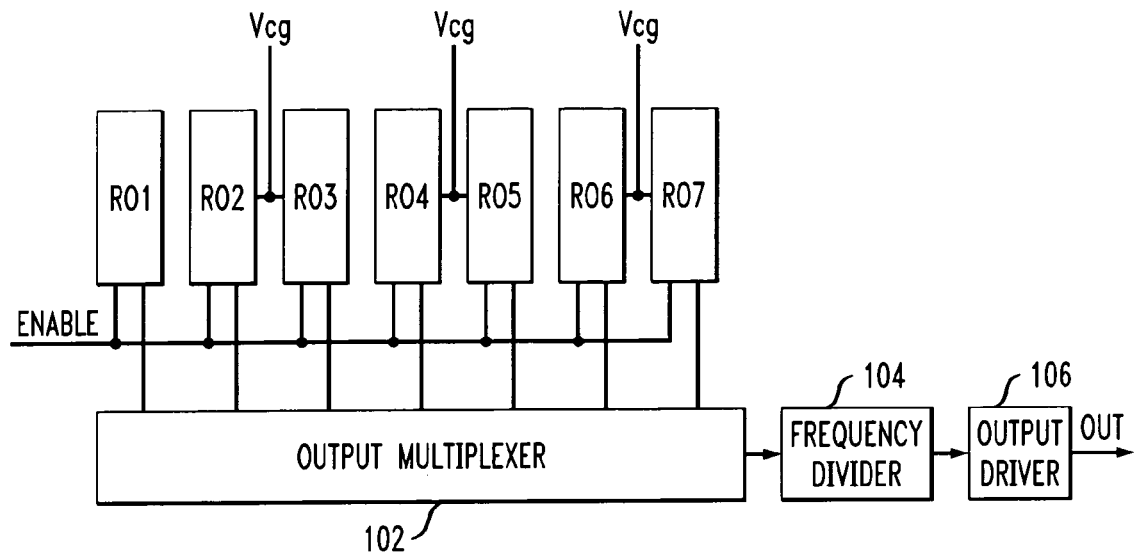
FIG. 1 is a circuit diagram illustrating a configuration of individually powered ring oscillators for inline gate capacitance measurement, according to an embodiment of the present invention.

Referring initially to FIG. 1, a circuit diagram illustrates a configuration of ring oscillator circuits for inline gate capacitance measurement, according to an embodiment of the present invention. Seven individually powered ring oscillator circuits RO1-7 are illustrated in FIG. 1, each sharing a common enable input, ENABLE. Only a single ring oscillator circuit is powered at any given time. While this embodiment of the present invention provides seven ring oscillator circuits for frequency comparison as described in more detail below, the techniques of the present invention may be implemented in any configuration of two or more ring oscillator circuits with at least one reference ring oscillator circuit and at least one gate capacitance ring oscillator circuit.

Reference ring oscillator circuit RO1 has stages with logic gates powered with a voltage, Vdd, from a first independent voltage source. In accordance with the preferred embodiment of the present invention, Vdd can be equal to or less than half the nominal power supply voltage for the technology, Vddn, thereby rendering a small signal measurement.

Gate capacitance ring oscillator circuits RO2-7 have stages with logic gates powered by a second voltage source. The voltage of the second voltage source is substantially equal to the voltage of the first voltage source, namely Vdd. Gate capacitance ring oscillator circuits are also provided with a voltage, Vcg, from a third independent voltage source to enable gate capacitance measurements as will be described in more detail below. The embodiments of the present invention have reference ring oscillator circuits and gate capacitance ring oscillator circuits with an identical number of stages.

A signal from an operating ring oscillator circuit is passed through an output circuit, preferably operating on a fourth independent voltage source at a voltage of Vddn. In a preferred embodiment of the present invention, the signal from the operating ring oscillator circuit first passes through a level shifter circuit. The level shifter circuit has an inverter with a weak pFET (high Vt) and a strong nFET (low Vt) so that the voltage level of the ring oscillator circuit is increased from Vdd to Vddn, the voltage level of the output circuit. The level shifter circuits are an integral part of output multiplexer 102, which performs an OR function on the outputs of all of the ring oscillator circuits. This signal is passed from output multiplexer 102, to a frequency divider 104 and output driver 106. Frequency divider 104 reduces the input frequency to a range that may be easily measured with a parametric tester, for example, at a few megahertz (MHz) or less. When an individual ring is being measured, the frequency input to frequency divider 104 is divided by, for example, 256.

Frequency measurements of the ring oscillator circuits are made using standard in-line test equipment and are applicable to any gate oxide thickness but in particular to gate oxide thicknesses of less than 1.2 nm. In addition to gate capacitance, these structures are also capable of providing measurements of circuit delay, oxide thickness (Tinv), Lp, dynamic threshold voltage, gate-tunneling current and subthreshold leakage currents. The test structures are made compact to fit in the limited space available on the chip kerf and are easily tested during manufacturing at a first level of metal to provide information on process control and model building.

Figure 2:
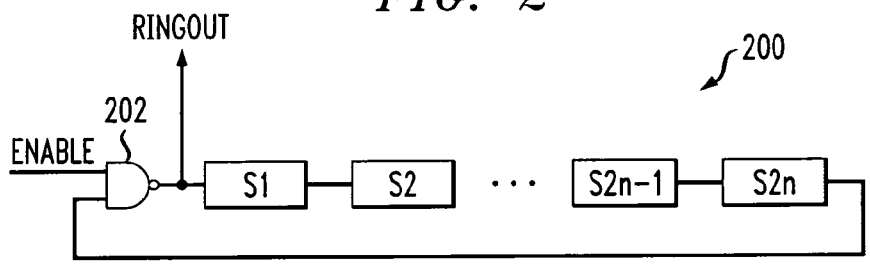
FIG. 2 is a circuit diagram illustrating a reference ring oscillator circuit, according to an embodiment of the present invention.

Both the reference ring oscillator circuits and the gate capacitance ring oscillator circuits are provided with an inverter as the driving CMOS circuit, or logic gate, per stage. However, additional embodiments of the present invention may utilize other forms or combinations of logic gates. Referring now to FIG. 2, a circuit diagram illustrates a reference ring oscillator circuit 200, according to an embodiment of the present invention. This may be considered a detailed description of reference ring oscillator circuit RO1 illustrated in FIG. 1. As shown in FIG. 2, reference ring oscillator circuit 200 has $2n$ stages, S1-S2$n$, as well as an embedded enabling NAND2 circuit 202.

According to an embodiment of the present invention, reference ring oscillator circuit 200 has fifty stages and an independent I/O pad for connection to the first independent voltage source, which serves as the power supply. The ground connection may be shared in some rings and there may be a common ENABLE signal I/O pad. Reference ring oscillator circuit 200 is enabled by applying Vdd to its power supply I/O pad while the power supply I/O pads for all other rings are held at ground. Thus, the ENABLE signal is set to a logical "1" and NAND2 circuit 202 is set to enable the ring to oscillate. The ring oscillator frequency, f, and the current drawn from Vdd in the oscillating (ENABLE=1) and quiescent states (ENABLE=0) of the ring, IDDA and IDDQ respectively, are measured for each ring using standard test equipment described above.

Figure 3:
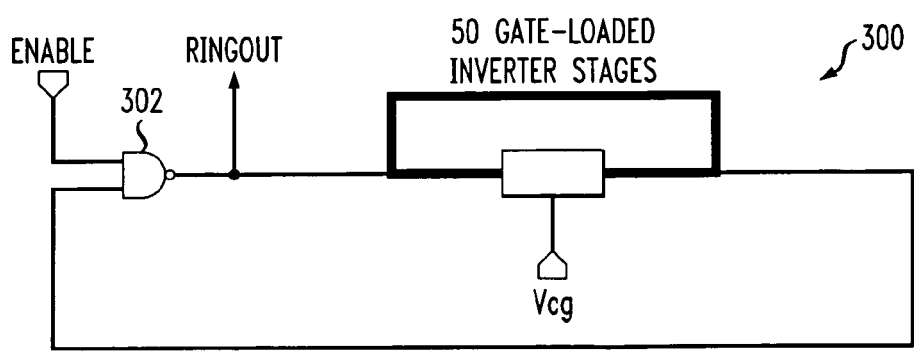
FIG. 3 is a circuit diagram illustrating a gate capacitance ring oscillator circuit having stages with FET loads, according to an embodiment of the present invention.

Referring now to FIG. 3, a circuit diagram illustrates a gate capacitance ring oscillator circuit 300 having stages that include FETs, according to an embodiment of the present invention. This may be considered a detailed description of any of gate capacitance ring oscillator circuits RO2-7 illustrated in FIG. 1. Gate capacitance ring oscillator circuit 300 is substantially identical to the reference ring oscillator circuit 200 of FIG. 2, in all respects except for the FET loads that are included in each stage. For example, gate capacitance ring oscillator circuit 300 also has an independent I/O pad for connection to the second independent voltage source for powering the logic gates in a preferred embodiment of the present invention. The FET loads are connected to a third independent voltage source providing a voltage of Vcg.

In accordance with a preferred embodiment of the present invention, gate capacitance ring oscillator circuit 300 also has 50 gate loaded inverters as well as an enabling NAND gate 302. Similar to the reference ring oscillator circuit of FIG. 2, gate capacitance ring oscillator circuit 300 is turned on by switching ENABLE from 0 to 1. A RINGOUT terminal connects to the output circuit as described above in FIG. 1. Additionally, the ring oscillator circuits of FIGS. 2 and 3 may be provided with additional circuitry as necessary to obtain desired logic function.

Figure 4A:
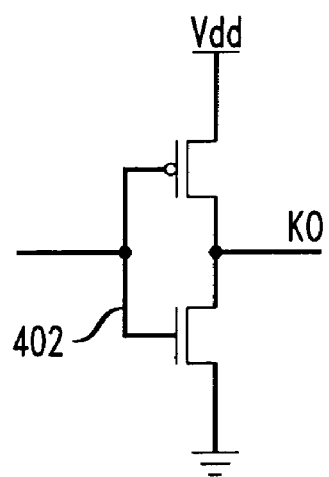
FIG. 4 is a circuit diagram illustrating ring oscillator circuit stages for a reference ring oscillator circuit and a gate capacitance ring oscillator circuit, according to an embodiment of the present invention.

Referring now to FIG. 4, a circuit diagram illustrates ring oscillator circuit stages for a reference ring oscillator circuit and a gate capacitance ring oscillator circuit, according to an embodiment of the present invention. FIG. 4a may be considered a detailed description of an individual stage of a reference ring oscillator circuit 200 illustrated in FIG. 2. An inverter 402 is shown with a voltage of Vdd and an output node of KO. As inverter 402 switches its state, the voltage of output node KO toggles between 0 and Vdd.

Figure 4B:
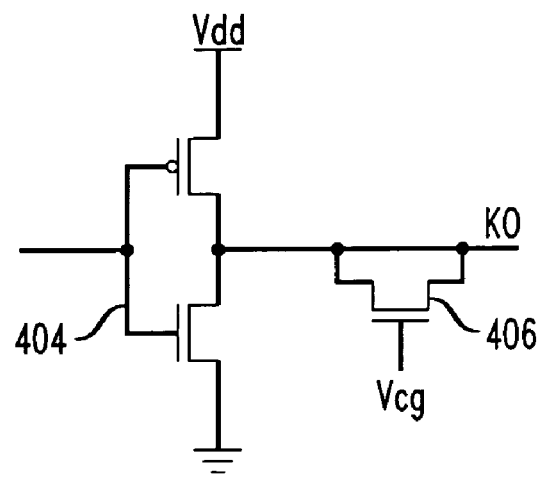

FIG. 4b may be considered a detailed description of an individual stage of gate capacitance ring oscillator circuit 300 illustrated in FIG. 3. An inverter 404 and a FET 406 are shown, with a voltage of Vdd at inverter 404 and a voltage of Vcg at FET 406. In this embodiment of the present invention, FET 406 is an nFET, having its source and drain connected to the output of inverter 404, and its gate connected to the voltage source supplying Vcg. As inverter 404 switches its state, output node KO toggles between 0 and Vdd and the voltage across a gate of FET 406 varies between Vcg and Vcg−Vdd. If Vdd is small, it acts as small signal voltage oscillation at a voltage bias point Vcv, where Vcv=Vcg−Vdd/2. Vcv is varied by setting discrete values of Vcg to cover the voltage range of interest for capacitance measurements.

The capacitance per stage of each ring is determined from its frequency and its active and standby currents. The difference in the capacitance between a reference ring oscillator circuit and a gate capacitance ring oscillator circuit is a small signal gate capacitance Cg of the FET load corresponding to a voltage bias point of Vcv.

Figure 5A:
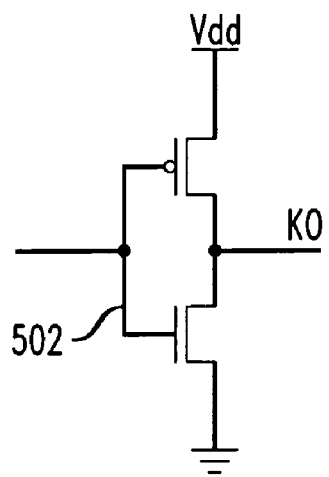
FIG. 5 is a circuit diagram illustrating ring oscillator circuit stages for a reference ring oscillator circuit and a gate capacitance ring oscillator circuit, according to an embodiment of the present invention.
Figure 5B:
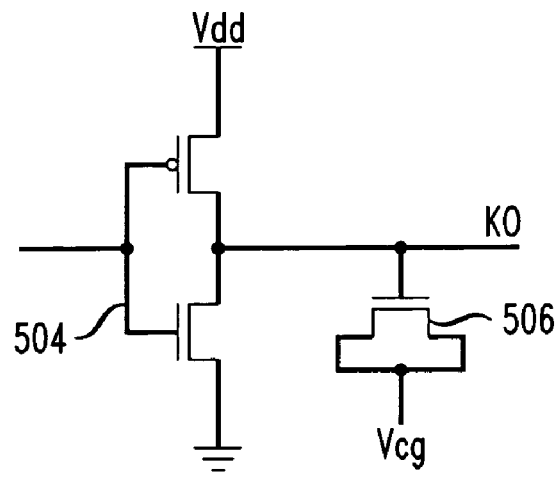

Referring now to FIG. 5, a circuit diagram illustrates ring oscillator circuit stages for a reference ring oscillator circuit and a gate capacitance ring oscillator circuit, according to an additional embodiment of the present invention. FIG. 5a is a stage of a reference ring oscillator circuit that is substantially identical to FIG. 4a, having an inverter 502. FIG. 5b is a stage of a gate capacitance ring oscillator circuit, having an inverter 504 and a FET 506. A gate of FET 506 is connected to the output of inverter 504 and Vcg is applied to the source and drain of FET 506.

As inverter 504 switches its state, output node KO toggles between 0 and Vdd and the voltage across a gate of FET 506 varies between Vdd−Vcg and −Vcg, and a voltage bias point Vcv, where Vcv=Vdd/2−Vcg. Both embodiments in FIGS. 4 and 5 may be utilized in accordance with the present invention and may be applied to pFET configurations as well.

For large n, the delay per stage of the ring, D, is given by $$D=1/(4nmf) \quad [1]$$

where m is frequency divide by factor in the output circuit. The capacitance per stage, Cs is computed as:

$$Cs=2D(IDDA-IDDQ)/Vdd \quad [2]$$

The gate capacitance of the nFET, Cg, is obtained from taking the difference in capacitances of a reference ring oscillator circuit and an additional ring oscillator circuit, $$Cg=Cs2-Cs1 \quad [3]$$

This difference technique eliminates the inverter and other parasitic capacitances. Cg is measured at a fixed Vdd and Vcg may be varied in the range of +/−twice Vddn, for the technology. This ensures that the nFET channel will sweep through accumulation, depletion and inversion states.

The change in delay per stage of the ring is proportional to Cg. To reduce test time, Cg may be explicitly calculated from Eq. [2] at a fixed value of Vcg and for all other values of Vcg, only the ring frequency is measured eliminating the time involved in measuring IDDA and IDDQ.

Figure 6:
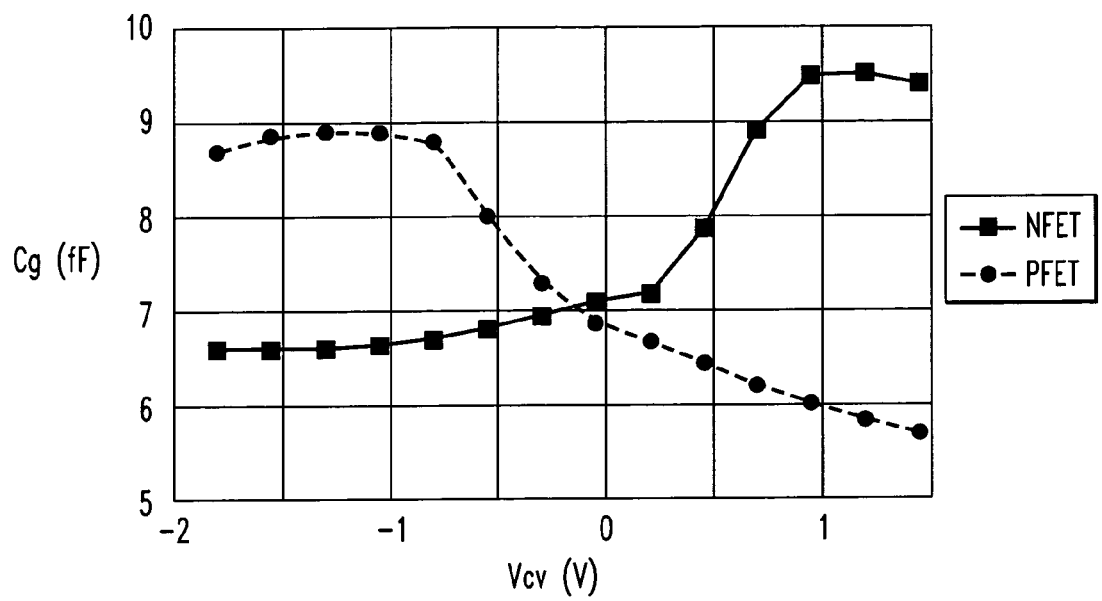
FIG. 6 is a graph illustrating voltage bias point versus gate capacitance for an nFET and a pFET, according to an embodiment of the present invention.

A plot of Cg vs. Vcv for both nFET and pFET is shown in FIG. 6. Cg reaches a maximum value, Cgi, when a conducting channel is formed between the source and drain and the FET is in its inversion state. Beyond this point, Cg=Cgi is independent of Vcv. With Vdd equal to or less than Vddn/2 the capacitance versus bias voltage characteristic may be broadened somewhat in the transition region (depletion to inversion) but this does not affect the Cg in the inversion region.

If a third ring oscillator circuit with a very long, Lp, for the load FET is added, the effective oxide thickness in the inversion region, Ti, is established.

$$Ti=(k*Lp*W)/Cgi \quad [4]$$

where W is the width of the load FET and k is the dielectric constant. For better accuracy, a difference technique is used with second and third ring oscillator circuits fitted with FET loads of polysilicon lengths Lp and (Lp+L). The measured Cgi2 and Cgi3 for the two rings together give both Ti and Lp, $$Lp=(L*Cgi2)/(Cgi3-Cgi2) \quad [5]$$

$$Ti=(k*Lp*W)/Cgi2 \quad [6]$$

The gate-tunneling current which varies exponentially with oxide thickness is measured from the difference in IDDQ of first and second ring oscillator circuits.

Figure 7:
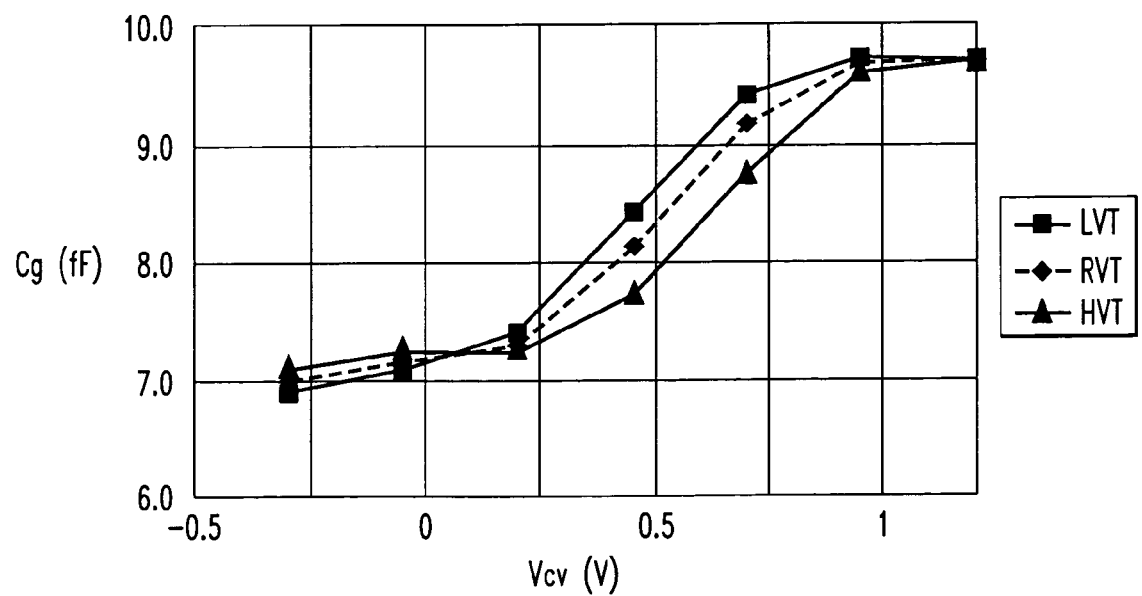
FIG. 7 is a graph illustrating voltage bias point versus gate capacitance for different nFET threshold voltages, according to an embodiment of the present invention.

The transition from depletion to inversion region gives a measure of the threshold voltage, Vt, of the FET. Simulation results of Cg vs. Vcv for low Vt (LVT), regular Vt (RVT) and high Vt (HVT) nFETs are shown in FIG. 7. The shift in voltage in the Cg vs. Vcv plot in the transition region corresponds to the Vt differences measured from standard DC techniques.

Referring back to FIG. 1, Tables 1 and 2 provide two examples using such a physical circuit layout, with differing gate load structures. Table 1 has three nFET and three pFET gate loaded stages using low, regular and high Vt FETs. Table 2 has nFETs and pFETs gate load of different Lp. In both cases the first ring RO1 is the reference ring.

TABLE 1

| Ring # | Load Type | Load Device Type | Load Lp (um) | Load Width (um) |
|---|---|---|---|---|
| 1 | None | RVT | 0.06 | — |
| 2 | Gate | RVT NFET | 0.06 | 6 |
| 3 | Gate | RVT PFET | 0.06 | 6 |
| 4 | Gate | LVT NFET | 0.06 | 6 |
| 5 | Gate | LVT PFET | 0.06 | 6 |
| 6 | Gate | HVT NFET | 0.06 | 6 |
| 7 | Gate | HVT PFET | 0.06 | 6 |

TABLE 2

| Ring # | Load Type | Load Device Type | Load Lp (um) | Load Width (um) |
|---|---|---|---|---|
| 1 | None | RVT | 0.06 | — |
| 2 | Gate | RVT NFET | 0.06 | 3 |
| 3 | Gate | RVT PFET | 0.06 | 3 |
| 4 | Gate | RVT NFET | 0.12 | 3 |
| 5 | Gate | RVT PFET | 0.12 | 3 |
| 6 | Gate | RVT NFET | 0.15 | 3 |
| 7 | Gate | RVT PFET | 0.15 | 3 |

The inverter in the reference ring oscillator circuit and gate capacitance ring oscillator circuits has pFET and nFET widths, Wp and Wn, of 1.8 micrometers (μm) and 1.2 μm, respectively. The width of the gate loads for "RCG" measurements is 6 μm in Table 1 and the polysilicon gate pitch is 0.25 μm. In Table 2, the gate load widths are 3 μm and the polysilicon gate pitch for the gate loads is 0.5 μm to accommodate longer Lp, while keeping the stage size constant. It is possible to layout these structures with a single layer of metal wiring using silicide for wire crossovers.

Figure 8:
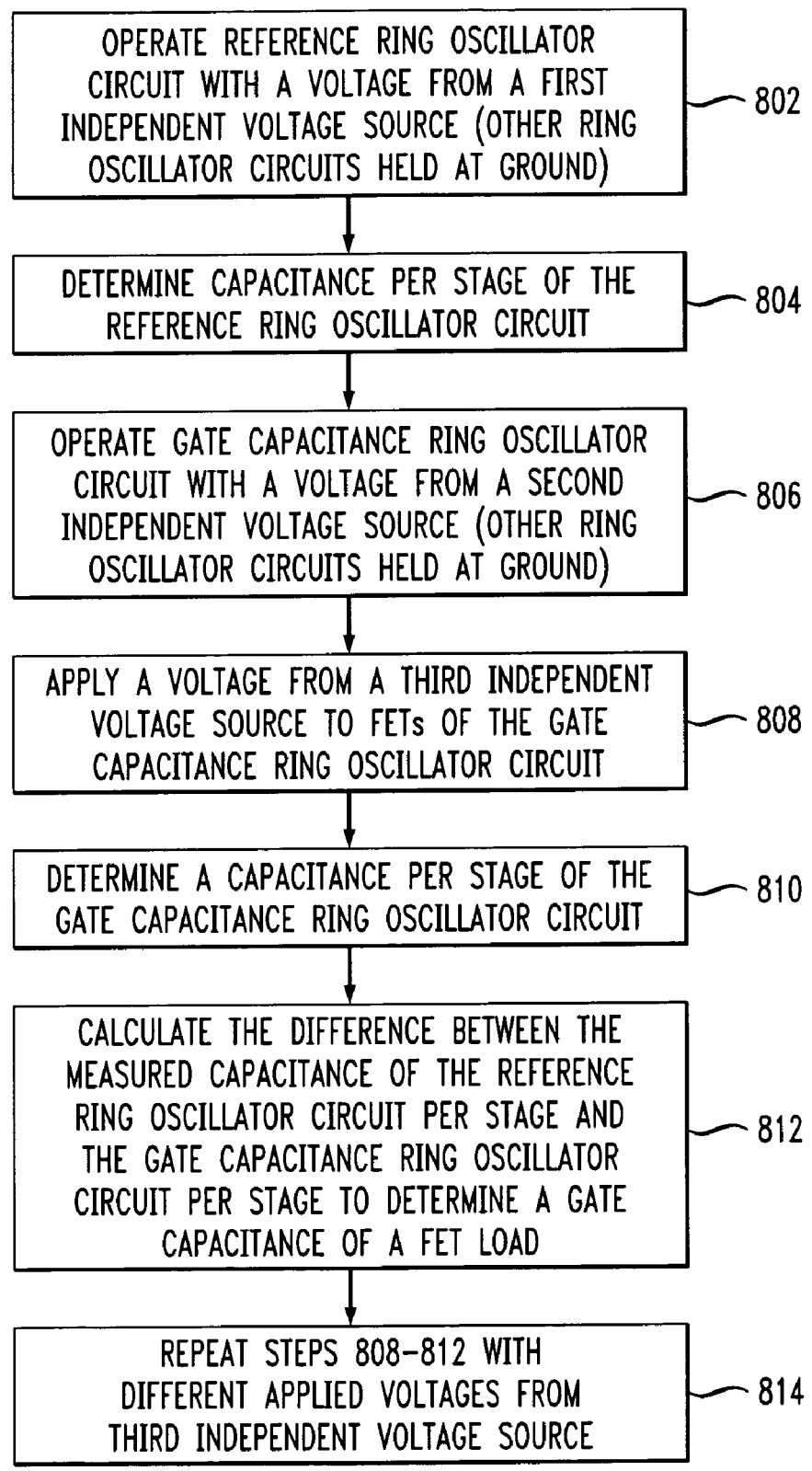
FIG. 8 is a flow diagram illustrating a gate capacitance measurement methodology, according to an embodiment of the present invention.

Referring now to FIG. 8, a flow diagram illustrates a gate capacitance measurement methodology, according to an embodiment of the present invention. The methodology begins in block 802, in which a reference ring oscillator circuit is operated with a voltage, Vdd, from a first independent voltage source, while all other ring oscillator circuits are held at ground. In block 804, a capacitance per stage of the reference ring oscillator circuit is determined from a frequency, and active and standby currents of the reference ring oscillator circuit.

In block 806, a gate capacitance ring oscillator circuit is operated with a voltage from a second independent voltage source, while all other ring oscillator circuits are held at ground. The first independent voltage source and second independent voltage source provide substantially equal voltages, Vdd, to their respective ring oscillator circuits. In block 808, a voltage, Vcg, from a third independent voltage source is applied to FETs of the gate capacitance ring oscillator circuit, resulting in an oscillating voltage across a gate of the FETs. In block 810, a capacitance per stage of the gate capacitance ring oscillator circuit is determined from a frequency and active and standby currents of the gate capacitance ring oscillator circuit.

In block 812, the difference between the measured capacitance of the reference ring oscillator circuit and gate capacitance ring oscillator circuit is calculated to determine a gate capacitance of a FET load, terminating the methodology. The gate capacitance of the FET load corresponds to a voltage bias point associated with Vdd, applied to the inverters, and Vcg, applied to the FETs. The amplitude of the voltage swing for the small signal capacitance measurement corresponds to Vdd. In block 814, the actions described in blocks 808, 810 and 812 are repeated multiple times with different applied voltage values from the third independent voltage source to generate the gate capacitance versus voltage bias point characteristic of the FET load.

As described above, any configuration of two or more ring oscillator circuits may be utilized in accordance with the embodiments of the present invention, with at least one reference ring oscillator circuit and at least one gate capacitance ring oscillator circuit.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An integrated circuit device comprising:
   a reference ring oscillator circuit having a plurality of stages, wherein each stage comprises a logic gate and electrically connecting to a first independent voltage source; and
   at least one additional ring oscillator circuit having a plurality of stages, wherein each stage comprises a logic gate substantially identical to the logic gates of the reference ring oscillator circuit and electrically connecting to a respective at least one second independent voltage source, and each stage further comprises a field effect transistor (FET) driven by a corresponding logic gate of the stage and electrically connecting to a third independent voltage source;
   wherein a measured difference in capacitance between the reference ring oscillator circuit per stage and the at least one additional ring oscillator circuit per stage comprises a small signal gate capacitance of a FET load.

2. The integrated circuit device of claim 1, wherein the reference ring oscillator circuit and the at least one additional ring oscillator circuit have an equal number of stages.

3. The integrated circuit device of claim 1, wherein the logic gate comprises an inverting logic gate.

4. The integrated circuit device of claim 1, wherein a peak-to-peak amplitude of a voltage swing for the gate capacitance measurement is substantially equal to a voltage of the at least one second independent voltage source.

5. The integrated circuit device of claim 1, wherein the FET comprises at least one of a negative field effect transistor (nFET) and a positive field effect transistor (pFET).

6. The integrated circuit device of claim 1, wherein a source and drain of the FET is electrically connected to the output of the logic gate and a gate of the FET electrically connecting to the third independent voltage source.

7. The integrated circuit device of claim 6, wherein the gate capacitance of the FET load corresponds to a voltage bias point that is substantially equal to a voltage of the third independent voltage source less half a voltage of the second independent voltage source.

8. The integrated circuit device of claim 1, wherein a source and drain of the FET electrically connecting to the third independent voltage source and a gate of the FET is electrically connected to the output of the logic gate.

9. The integrated circuit device of claim 8, wherein the gate capacitance of the FET load corresponds to a voltage bias point that is substantially equal to a voltage of half the second independent voltage source less a voltage of the third independent voltage source.

10. The integrated circuit device of claim 1, further comprising:
    an output multiplexer electrically connected to an output of the reference ring oscillator circuit and an output of the at least one additional ring oscillator circuit and electrically connecting to the fourth independent voltage source;
    a frequency divider circuit electrically connected to the output multiplexer and electrically connecting to the fourth independent voltage source; and
    an output driver electrically connected to the frequency divider circuit and electrically connecting to the fourth independent voltage source.

11. The integrated circuit device of claim 10, wherein the output multiplexer shifts a logic signal from a lower value to a higher value, wherein the higher value is at least twice the lower value.

12. The integrated circuit device of claim 10, wherein the first and second independent voltage sources provide a voltage less than or equal to half a nominal power supply voltage and the fourth independent voltage source provides a voltage substantially equal to a nominal power supply voltage.

13. The integrated circuit device of claim 1, wherein the at least one additional ring oscillator circuit comprises a first ring oscillator circuit with each of the logic gates electrically connected to a corresponding pFET, and a second ring oscillator circuit with each of the logic gates electrically connected to a corresponding nFET.

14. A method of measuring gate capacitance in an integrated circuit device comprising the steps of:
  measuring a capacitance of a reference ring oscillator circuit having a plurality of stages, wherein each stage comprises a logic gate and electrically connecting to a first independent voltage source;
  measuring a capacitance of at least one additional ring oscillator circuit having a plurality of stages, wherein each stage comprises a logic gate substantially identical to the logic gates of the reference ring oscillator circuit and electrically connecting to a respective at least one second independent voltage source, and each stage further comprises a field effect transistor (FET) driven by a corresponding logic gate of the stage and electrically connecting to a third independent voltage source; and
  calculating the difference between the measured capacitance of the reference ring oscillator circuit per stage and the at least one additional ring oscillator circuit per stage to determine a small signal gate capacitance of a FET load.

15. The method of claim 14, wherein the step of measuring a capacitance of at least one additional ring oscillator circuit and calculating the difference between the measured capacitances is repeated for a number of different voltage values from the third independent voltage source in order to produce a small signal capacitance versus bias voltage characteristic of a FET load.

16. The method of claim 14, wherein the step of measuring a capacitance of a reference ring oscillator circuit comprises the steps of:
  operating the reference ring oscillator circuit with a voltage from the first independent voltage source while the at least one additional ring oscillator circuit is held at ground; and
  determining a capacitance per stage of the reference ring oscillator circuit from a frequency and active and standby currents of the reference ring oscillator circuit.

17. The method of claim 16, wherein, in the step of operating the reference ring oscillator circuit, the voltage from the first independent voltage source is less than or equal to half a nominal power supply voltage.

18. The method of claim 16, wherein the step of measuring a capacitance of at least one additional ring oscillator circuit comprises the steps of:
  operating the at least one additional ring oscillator circuit with a voltage from the second independent voltage source while the reference ring oscillator circuit is held at ground, wherein the voltage from the second independent voltage source is substantially equal to the voltage from the first independent voltage source that operated the reference ring oscillator circuit;
  applying a voltage to the FET from the third independent voltage source, resulting in an oscillating voltage across a gate of the FET; and
  determining a capacitance per stage of the at least one additional ring oscillator circuit from a frequency and active and standby currents of the at least one additional ring oscillator circuit.

19. The method of claim 14, wherein, in the step of calculating the difference between the measured capacitance of the ring oscillator circuits, the gate capacitance of the FET load corresponds to a voltage bias point associated with a voltage from the second independent voltage source applied to the at least one additional ring oscillator circuit and a voltage from the third independent voltage source applied to the load FET and the amplitude of the voltage swing for the small signal capacitance measurement corresponds to the voltage of the second independent voltage source.

20. The method of claim 14, wherein the gate capacitance of a FET load is determined over a range of voltage values of the third independent voltage source to produce a gate capacitance as a function of voltage bias point characteristic.

21. An article of manufacture for measuring gate capacitance in an integrated circuit device, comprising a machine readable medium containing one or more programs which when executed implement the steps of:
  measuring a capacitance of a reference ring oscillator circuit having a plurality of stages, wherein each stage comprises a logic gate and electrically connecting to a first independent voltage source;
  measuring a capacitance of at least one additional ring oscillator circuit having a plurality of stages, wherein each stage comprises a logic gate substantially identical to the logic gates of the reference ring oscillator circuit and electrically connecting to a respective at least one second independent voltage source, and each stage further comprises a FET driven by a corresponding logic gate of the stage and electrically connecting to a third independent voltage source; and
  calculating the difference between the measured capacitance of the reference ring oscillator circuit per stage and the at least one additional ring oscillator circuit per stage to determine a small signal gate capacitance of a FET load.

* * * * *